United States Patent
Chang et al.

(10) Patent No.: US 6,560,864 B1
(45) Date of Patent: May 13, 2003

(54) PROCESS FOR MANUFACTURING A FLAT COIL

(75) Inventors: Jei-Wei Chang, Cupertino, CA (US); Kochan Ju, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 22 days.

(21) Appl. No.: 09/992,517

(22) Filed: Nov. 14, 2001

(51) Int. Cl.$^7$ .................................................. H05K 3/02
(52) U.S. Cl. ............................ 29/846; 29/847; 29/852; 29/604; 29/605; 29/606
(58) Field of Search ...................... 29/603.01, 603.07, 29/603.13, 603.14, 603.15, 603.16, 604, 605, 606, 846, 847, 852; 205/90.2, 90.3, 119, 122, 182, 223; 216/100, 78, 105; 360/123; 438/637, 641, 672, 675

(56) References Cited

U.S. PATENT DOCUMENTS

| | | | |
|---|---|---|---|
| 4,078,980 A | * 3/1978 | Harris et al. ................ 205/656 |
| 4,694,368 A | * 9/1987 | Bischoff et al. ............ 360/123 |
| 4,899,434 A | * 2/1990 | Roberts ..................... 29/603.12 |
| 5,356,832 A | * 10/1994 | Mori et al. ........... 148/DIG. 95 |
| 5,372,749 A | * 12/1994 | Li et al. ...................... 252/512 |
| 5,436,504 A | * 7/1995 | Chakravorty et al. ....... 174/258 |
| 5,684,660 A | 11/1997 | Gray et al. .................. 360/126 |
| 5,751,522 A | 5/1998 | Yamada et al. .............. 360/113 |
| 5,777,824 A | 7/1998 | Gray .......................... 360/103 |
| 5,875,080 A | 2/1999 | Seagle ........................ 360/123 |
| 5,926,349 A | 7/1999 | Krounbi et al. ............. 360/113 |
| 6,015,749 A | * 1/2000 | Liu et al. .................... 438/628 |
| 6,260,256 B1 | * 7/2001 | Sasaki ..................... 29/603.01 |
| 6,383,401 B1 | * 5/2002 | Labzentis et al. ............. 216/13 |

OTHER PUBLICATIONS

Yue Kuo et al., "A New Copper Reactive Ion Etching Process," Proceedings of the '99 Joint International Meeting of the ECS, ECSJPN, and JPN SAP (Nov. 1, 1999).

* cited by examiner

Primary Examiner—Carl J. Arbes
Assistant Examiner—Tai Nguyen
(74) Attorney, Agent, or Firm—George O. Saile; Stephen B. Ackerman

(57) ABSTRACT

A process for manufacturing a flat coil for use as the write head in a magnetic disk system is disclosed. The process starts with a blanket seed layer which is coated with a photoresist frame that defines the shape of the coil. The latter is then electroformed from the seed layer within the confines of said frame. Key features of the invention include capping the coil with a layer of gold to protect it during the removal of copper that is exposed after photoresist removal, using reactive ion etching to convert the exposed copper to the chloride (which is then easily rinsed away), and then removing all last traces of chlorides through an ashing process.

30 Claims, 3 Drawing Sheets

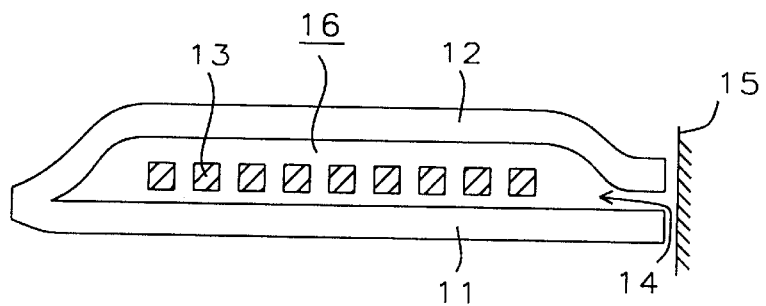
FIG. 1 – Prior Art
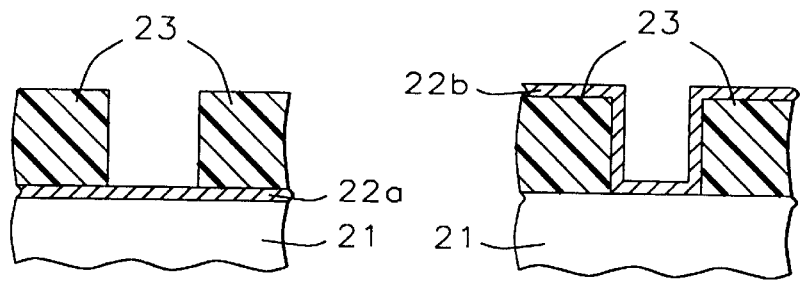
FIG. 2a – Prior Art
FIG. 2b – Prior Art
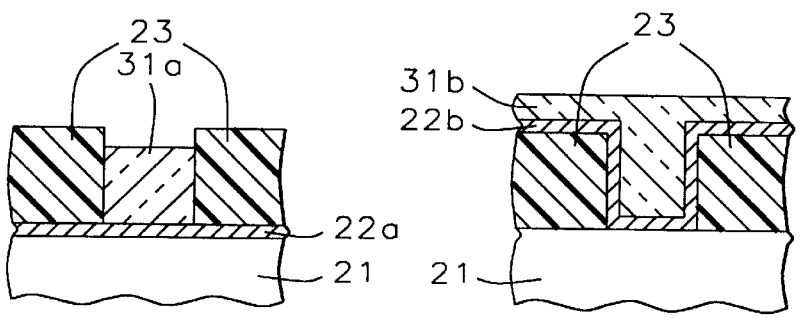
FIG. 3a – Prior Art
FIG. 3b – Prior Art

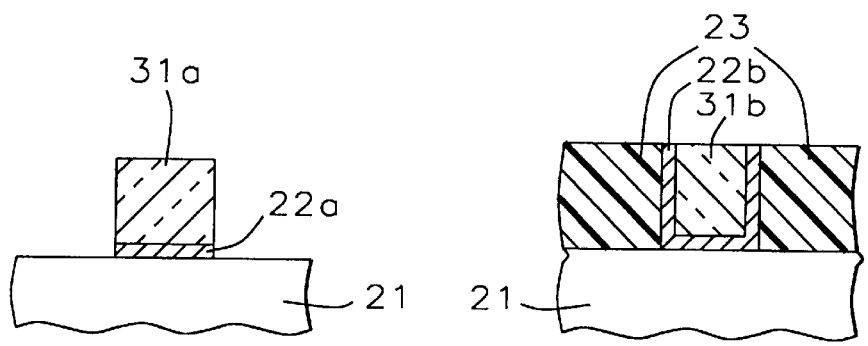
FIG. 4a – Prior Art   FIG. 4b – Prior Art
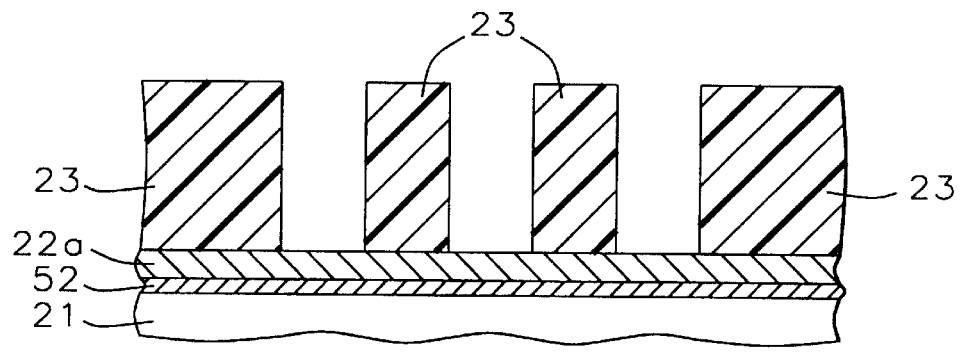
FIG. 5
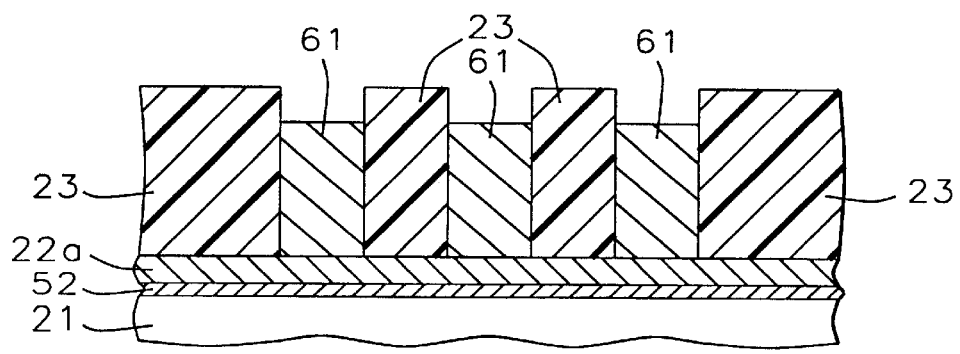
FIG. 6

PROCESS FOR MANUFACTURING A FLAT COIL

FIELD OF THE INVENTION

The invention relates to the general field of magnetic disks with particular reference to fabricating miniaturized write coils having high aspect ratios.

BACKGROUND OF THE INVENTION

Referring to FIG. 1, we show, in schematic representation, a cross-sectional view of a write head for a magnetic disk system. The magnetic field needed to perform the write operation is generated by flat coil 16 made up of a number of turns, with 13 being an example of one side of a single turn. Surrounding the flat coil is magnetic material comprising upper and lower pole pieces 12 and 11 respectively. These pole pieces are joined at one end (on the left in this figure) and are separated by small gap 14 at the other end. The magnetic field that is generated by flat coil 16 ends up being concentrated at gap 14. It is sufficiently powerful that the fringing field that extends outwards away from gap 14 is capable of magnetizing the magnetic storage medium over whose surface 15 the head 'flies'. The distance between gap 14 and surface 15 is typically between about 0.005 and 0.075 microns.

As write heads continue to develop, a need has arisen for coils that are both more compact as well as having greater current carrying capability. This implies coils that have of the order of 3–20 turns made up of wires whose widths are less than about 0.5 microns and that are separated from one another by less than about 0.5 microns. Thus, to retain adequate cross-sectional area, it is necessary for coils to be at least about 1 microns thick.

Manufacturing coils whose windings have the required high aspect ratios have presented the industry with formidable challenges. Two requirements, inter alia, have to be met. The first is that the material for the coils have little or no built-in stress. The second is that a method other than subtractive (i.e. post deposition) etching be used. Electroplating meets both these requirements. Once a seed layer (almost always of copper) which can be connected to a source of electrical power is available on a substrate, it becomes possible to place a non-conductive mask on the seed layer and to then build up the uncovered areas through electroplating.

Once the coil has been electroformed, it is still necessary to remove all seed layer material that is not directly beneath the coil. This is a particularly difficult problem for copper when such high aspect ratios and narrow separations between windings are involved. Since both the seed layer and the coil are made of copper, a highly anisotropic etching process must be used to ensure that no vertical surfaces (such as the sides of the copper coil) are attacked, etching being limited to horizontal surfaces. This means that reactive ion etching (RIE), or similar process, must be used. RIE, in turn, depends on the generation of gaseous reaction products, which is not the case for copper.

Until recently this problem has precluded routine use of RIE for copper etching. However, a method for overcoming this was recently proposed by Yue Kuo and S. Lee in "A new copper reactive ion etching process" in the Proceedings of the '99 Joint International Meeting of the ECS, ECSJPN, and JPN SAP (Nov. 1, 1999). Their method relies on the formation of copper chloride which can later be selectively removed using a liquid etchant. Although this represents an improvement over earlier practices, problems still remain. In particular, some of the copper coil itself is also converted to copper chloride, thereby reducing the coil thickness, and a certain amount of copper chloride remains behind despite the use of the liquid etchant. The present invention provides solutions to both these problems.

An alternative approach to the blanket seed layer method described above is the damascene method in which the photoresist frame is formed before deposition of the seed layer. For a comparison of the blanket seed and damascene methods we refer now to FIGS. 2a and 2b. Seen in both figures is substrate 21 and photoresist frame 23. However, in FIG. 2a the frame sits over the seed layer 22a while in FIG. 2b the seed layer 22b has been deposited over the frame. FIGS. 3a and 3b show the electroplated layers 31a and 31b respectively. 31a is required to end slightly below the top of frame 23 while 31b must be thick enough to fully fill the frame, causing its thickness to be about twice that of 31a.

FIG. 4a shows the structure after removal of the photoresist and all seed layer not under coil fragment 31a. In FIG. 4b the structure is seen after the surface has been planarized and polished down (generally using chemical mechanical polishing, or CMP) until the top surface of photoresist 23 is exposed, thereby allowing it to be removed, leaving behind the desired coil.

Although the damascene approach solves the problem of how to remove unplated areas of seed layer, it is actually subject to severe limitations. As the aspect ratio of the windings increases and their separation decreases, there is a growing danger of forming voids in the separation area between coils because of loading effects that cause copper on opposing top surfaces to meet before the separation area is fully filled in. Additionally, it is clear that the damascene approach sets limits on the thickness of the seed layer, particularly if it is preceded by a 'glue' layer to improve adhesion of the copper to the substrate. Again, the problem of the formation of 'keyhole' voids when filling spaces of high aspect ratio is well known. It is thus clear that flat coils having high aspect ratio and narrow separation between coils will need to be fabricated using the blanket seed approach.

Finally, we note that attempts to remove the seed layer by ion beam milling after formation of the coil, using the coil as its own mask, have been unsuccessful. This is because of shadowing effects—the high aspect ratio of the coil makes it very difficult for ions to reach the seed layer without first glancing off the side-walls of the coils which causes the removal of substantial amounts of material therefrom.

A routine search for prior art was performed. Although several references of interest were found none describe the exact process that constitutes the present invention. Thus, for example, in U.S. Pat. No. 5,926,349, Krounbi et al. teach a plate-up coil process. Coil manufacturing processes based on electroplating are disclosed in U.S. Pat. No. 5,777,824 (Gray) and U.S. Pat. No. 5,684,660 (Gray et al.), while other plating processes are taught in U.S. Pat. No. 5,875,080 (Seagle) and U.S. Pat. No. 5,751,522 (Yamada et al.).

SUMMARY OF THE INVENTION

It has been an object of the present invention to provide a process for manufacturing a flat coil for use in the write head of a magnetic disk system.

Another object of the invention has been to be able to manufacture flat coils having very high aspect ratios and very small separation between windings.

A further object of the invention has been to manufacture a flat coil that is protected against corrosion failure during its life.

These objects have been achieved by using the blanket seed layer process wherein the coil is electroformed from the seed layer within the confines of a photoresist frame. Key features of the invention include capping the coil with a layer, of gold to protect it during the removal of copper that is exposed after photoresist removal, using RIE to convert the exposed copper to the chloride (which is then easily rinsed away), and then removing all last traces of said chlorides through an ashing process.

BRIEF DESCRIPTION OF THE DRAWINGS

FIG. 1 is a schematic cross-section of a write head for a magnetic disk system.

FIGS. 2a and b through 4a and b compare the blanket seed layer process with the damascene process for forming a flat coil.

FIG. 5 shows the starting point for the process of the present invention, including a photoresist frame that defines the shape of the coil.

FIG. 6 shows the coil after it has been electroformed within the frame.

DESCRIPTION OF THE PREFERRED EMBODIMENTS

Referring now to FIG. 5, we show there a schematic representation of the starting point of the process of the present invention. Substrate 21 (of a non-conductive material such as hard-baked photoresist, aluminum oxide, or silicon oxide) has been coated with a 'glue' layer 21 of titanium which is between about 10 and 200 Angstroms thick, with a preferred thickness of about 100 Angstroms. Note that, although we will continue our description in terms of titanium, chromium or tantalum could have been used in place of titanium. This is followed by the deposition of copper seed layer 22a (between about 300 and 2,000 Angstroms thick with about 600 Angstroms being preferred). The titanium and copper seed layers are deposited by either physical deposition or CVD (chemical vapor deposition), with former being preferred.

Copper layer 22a is then coated with photoresist, the latter being patterned and developed to form photoresist frame 23 that defines the shape of a coil. Then, as seen in FIG. 6, additional copper layer 61 is grown on all exposed copper surfaces by means of electroplating. The thickness of the copper coil at the conclusion of electroplating is between about 0.5 and 2.5 microns.

Figure 7:
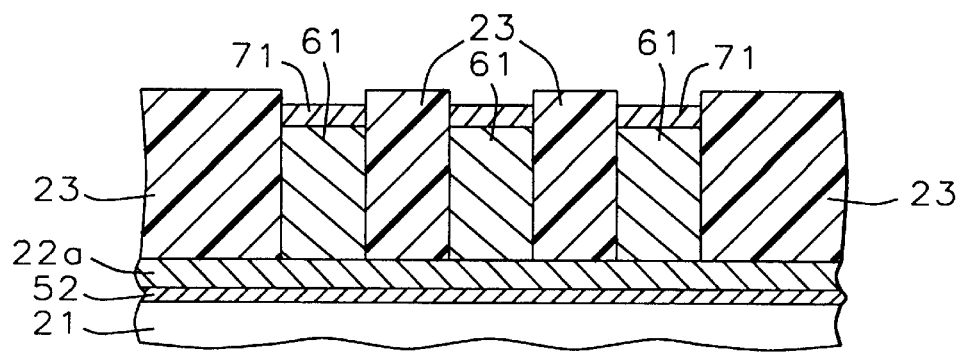
FIG. 7 shows the coil after a protective gold layer has been added.

The next step, illustrated in FIG. 7, is a key feature of the invention. It is the deposition of gold layer 71 on the surface of copper layer 61. We have found two different ways of depositing this layer to be equally effective.

In a first embodiment of the invention, gold layer 71 is deposited by means of electroplating while in a second embodiment it is deposited by means of electroless plating. For both embodiments our preferred thickness for gold layer 71 has been about 0.1 microns although any thickness between about 0.05 and 0.3 microns would still work. The purpose of the gold layer is to protect the top surface of copper coil 61 during the etching and rinsing steps that follow. This allows the height of the coil to be limited only by the dimensions of the photoresist frame. Gold layer 71 also serves to protect the coil from atmospheric corrosion during its life.

Figure 8:
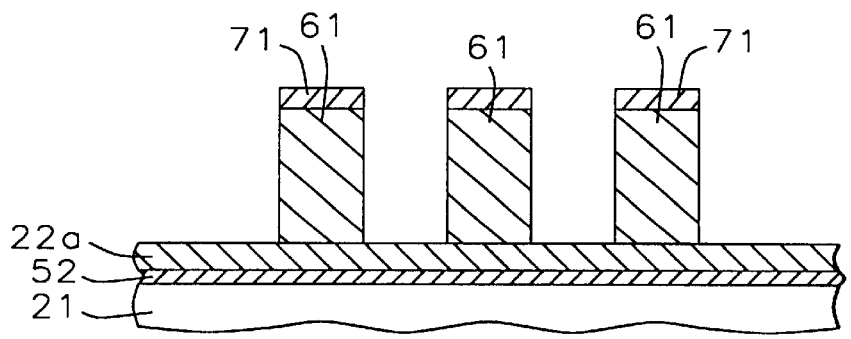
FIG. 8 shows the structure after photoresist stripping.

After the removal of all photoresist, the structure has the appearance illustrated in FIG. 8. However, although layer 61 has the shape of a coil, it is still shorted out by (newly exposed) seed layer 22a as well as by titanium glue layer 52. Reactive ion etching is used to effect the removal of seed layer 22a. This is accomplished by immersing the structure in a gaseous mixture that has been electrically excited to form a plasma. The effect of this is to convert all horizontal surfaces of copper to copper chloride. As noted above, the process is highly anisotropic so vertical surfaces (in particular the side-walls of the coil) are not attacked. Details of the process are as follows:

Using RF, a plasma is excited in chlorine gas whose flow rate is between 2 and 20 SCCM, with pressure being adjusted to between 0.5 and 0.2 Pa. Etch rates ranged from 100 to 3,000 Angstroms per minute. Substrate temperature was kept below 100° C.

Figure 9:
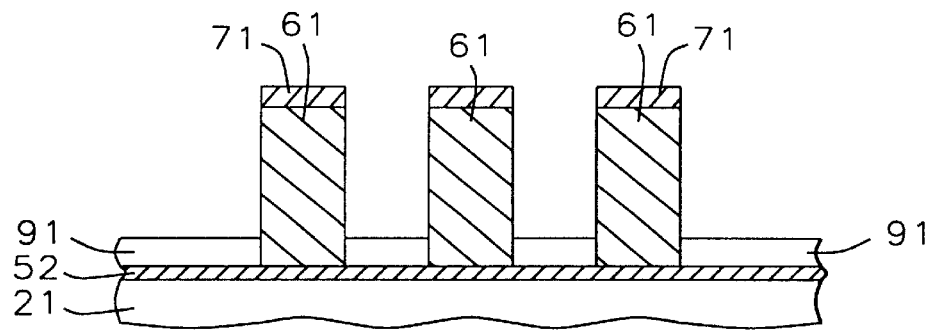
FIG. 9 shows the structure after the exposed seed layer has been converted to copper chloride.
Figure 10:
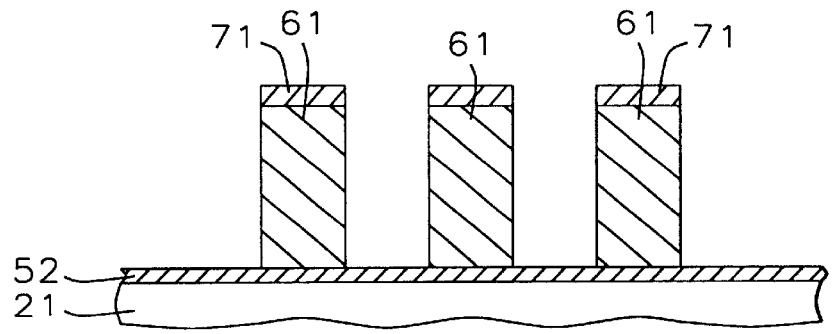
FIG. 10 shows the end product of the process.

Since copper chloride is not volatile, it remains on the surface within the coil. This is shown as layer 91 in FIG. 9. Note that, because of the presence of gold layer 71, no copper chloride has formed on the top surface of the coil. Once all exposed copper horizontal surfaces have been converted to copper chloride it is necessary to remove the latter. This is accomplished by rinsing in a very dilute solution of hydrochloric acid (concentration between about 0.01 and 0.1 molar %) and a pH that is less than 1, giving the structure the appearance illustrated in FIG. 10.

As noted earlier, the rinsing process cannot be relied upon to fully remove all last traces of copper chloride. Additionally, at this stage partial titanium layer 52 still remains in place which means that the coil is still being shorted out. Therefore, in another key feature of the invention, the process concludes with an ashing step. This involves exposing the coil and the titanium to an oxygen plasma, thereby removing any remaining copper chloride and converting all remaining titanium to titanium oxide. Details of the ashing procedure include using an oxygen plasma at a temperature that is 5–10° C. above room temperature. Oxygen flow rate was from 10–200 SCCM and oxidation times ranged from 0.5 to 10 minutes.

While the invention has been particularly shown and described with reference to the preferred embodiments thereof, it will be understood by those skilled in the art that various changes in form and details may be made without departing from the spirit and scope of the invention.

What is claimed is:

1. A process for manufacturing a flat coil, comprising the sequential steps of:

providing a substrate;

on said substrate, depositing a layer of titanium and then a seed layer of copper;

coating the copper layer with photoresist and then patterning and developing the photoresist to form a frame that defines the shape of a coil;

by means of electroplating, depositing additional copper on all exposed copper surfaces, said electroplated copper having an upper surface and a thickness;

by means of electroplating, depositing a layer of gold on said upper surface;

removing all photoresist;

by means of reactive ion etching in a gaseous mixture, converting all copper in said seed layer to copper chloride;

removing the copper chloride by rinsing in very dilute hydrochloric acid, thereby forming the flat coil and exposing said titanium layer; and exposing the coil and the titanium to an oxygen plasma thereby removing any remaining copper chloride and converting all titanium to titanium oxide.

2. The process of claim 1 wherein the titanium layer is deposited to a thickness that is between about 10 and 200 Angstroms.

3. The process of claim 1 wherein the copper seed layer is deposited to a thickness between about 300 and 2,000 Angstroms.

4. The process of claim 1 wherein the thickness of the copper coil is between about 0.5 and 2.5 microns.

5. The process of claim 1 wherein the gold layer is deposited to a thickness between about 0.05 and 0.3 microns.

6. The process of claim 1 wherein said very dilute solution has a hydrochloric acid concentration between about 0.01 and 0.1 molar % and a pH that is less than 1.

7. The process of claim 1 wherein the step of exposing the coil and the titanium to an oxygen plasma further comprises using an oxygen plasma at a temperature that is 5–10° C. above room temperature, at a flow rate from 10–200 SCCM, for 0.5 to 10 minutes.

8. The process of claim 1 wherein the step of reactive ion etching in a gaseous mixture further comprises using RF to excite a plasma in chlorine gas whose flow rate is between 2 and 20 SCCM, at a pressure between 0.5 and 0.2 Pa, and a substrate temperature below 100° C., thereby achieving etch rates between 100 to 3,000 Angstroms per minute.

9. The process of claim 1 wherein the titanium and copper seed layers are deposited by physical vapor deposition.

10. The process of claim 1 wherein the substrate is selected from the group consisting of hard-baked photoresist, aluminum oxide, and silicon oxide.

11. A process for manufacturing a flat coil, comprising the sequential steps of:

providing a substrate;

on said substrate, depositing a layer of titanium and then a seed layer of copper;

coating the copper layer with photoresist and then patterning and developing the photoresist to form a frame that defines the shape of a coil;

by means of electroplating, depositing additional copper on all exposed copper surfaces, said electroplated copper having an upper surface and a thickness;

by means of electroless plating, depositing a layer of gold on said upper surface;

removing all photoresist;

by means of reactive ion etching in a gaseous mixture, converting all copper in said seed layer to copper chloride;

removing the copper chloride by rinsing in very dilute hydrochloric acid, thereby forming the flat coil and exposing said titanium layer; and exposing the coil and the titanium to an oxygen plasma thereby removing any remaining copper chloride and converting all titanium to titanium oxide.

12. The process of claim 11 wherein the titanium layer is deposited to a thickness that is between about 10 and 200 Angstroms.

13. The process of claim 11 wherein the copper seed layer is deposited to a thickness between about 300 and 2,000 Angstroms.

14. The process of claim 11 wherein the thickness of the copper coil is between about 0.5 and 2.5 microns.

15. The process of claim 11 wherein the gold layer is deposited to a thickness between about 0.05 and 0.3 microns.

16. The process of claim 11 wherein said very dilute solution has a hydrochloric acid concentration between about 0.01 and 0.1 molar % and a pH that is less than 1.

17. The process of claim 11 wherein the step of exposing the coil and the titanium to an oxygen plasma further comprises using an oxygen plasma at a temperature that is 5–10° C. above room temperature, at a flow rate from 10–200 SCCM, for 0.5 to 10 minutes.

18. The process of claim 11 wherein the step of reactive ion etching in a gaseous mixture further comprises using RF to excite a plasma in chlorine gas whose flow rate is between 2 and 20 SCCM, at a pressure between 0.5 and 0.2 Pa, and a substrate temperature below 100° C., thereby achieving etch rates between 100 to 3,000 Angstroms per minute.

19. The process of claim 11 wherein the titanium and copper seed layers are deposited by physical vapor deposition.

20. The process of claim 11 wherein the substrate is selected from the group consisting of hard-baked photoresist, aluminum oxide, and silicon oxide.

21. A process for manufacturing a flat coil, comprising the sequential steps of:

providing a substrate;

on said substrate, depositing a layer of chromium and then a seed layer of copper;

coating the copper layer with photoresist and then patterning and developing the photoresist to form a frame that defines the shape of a coil;

by means of electroplating, depositing additional copper on all exposed copper surfaces, said electroplated copper having an upper surface and a thickness;

by means of electroplating, depositing a layer of gold on said upper surface;

removing all photoresist;

by means of reactive ion etching in a gaseous mixture, converting all copper in said seed layer to copper chloride;

removing the copper chloride by rinsing in very dilute hydrochloric acid, thereby forming the flat coil and exposing said chromium layer; and exposing the coil and the chromium to an oxygen plasma thereby removing any remaining copper chloride and converting all chromium to chromium oxide.

22. The process of claim 21 wherein the chromium layer is deposited to a thickness that is between about 10 and 200 Angstroms.

23. The process of claim 21 wherein the chromium and copper seed layers are deposited by physical vapor deposition.

24. A process for manufacturing a flat coil, comprising the sequential steps of:

providing a substrate;

on said substrate, depositing a layer of chromium and then a seed layer of copper;

coating the copper layer with photoresist and then patterning and developing the photoresist to form a frame that defines the shape of a coil;

by means of electroplating, depositing additional copper on all exposed copper surfaces, said electroplated copper having an upper surface and a thickness;

by means of electroless plating, depositing a layer of gold on said upper surface;

removing all photoresist;

by means of reactive ion etching in a gaseous mixture, converting all copper in said seed layer to copper chloride;

removing the copper chloride by rinsing in very dilute hydrochloric acid, thereby forming the flat coil and exposing said chromium layer; and exposing the coil and the chromium to an oxygen plasma thereby removing any remaining copper chloride and converting all chromium to chromium oxide.

25. The process of claim 24 wherein the chromium layer is deposited to a thickness that is between about 10 and 200 Angstroms.

26. The process of claim 24 wherein the chromium and copper seed layers are deposited by physical vapor deposition.

27. A process for manufacturing a flat coil, comprising the sequential steps of:

providing a substrate;

on said substrate, depositing a layer of tantalum and then a seed layer of copper;

coating the copper layer with photoresist and then patterning and developing the photoresist to form a frame that defines the shape of a coil;

by means of electroplating, depositing additional copper on all exposed copper surfaces, said electroplated copper having an upper surface and a thickness;

by means of electroplating, depositing a layer of gold on said upper surface;

removing all photoresist;

by means of reactive ion etching in a gaseous mixture, converting all copper in said seed layer to copper chloride;

removing the copper chloride by rinsing in very dilute hydrochloric acid, thereby forming the flat coil and exposing said tantalum layer; and exposing the coil and the tantalum to an oxygen plasma thereby removing any remaining copper chloride and converting all tantalum to tantalum oxide.

28. The process of claim 27 wherein the tantalum layer is deposited to a thickness that is between about 10 and 200 Angstroms.

29. A process for manufacturing a flat coil, comprising the sequential steps of:

providing a substrate;

on said substrate, depositing a layer of tantalum and then a seed layer of copper;

coating the copper layer with photoresist and then patterning and developing the photoresist to form a frame that defines the shape of a coil;

by means of electroplating, depositing additional copper on all exposed copper surfaces, said electroplated copper having an upper surface and a thickness;

by means of electroless plating, depositing a layer of gold on said upper surface;

removing all photoresist;

by means of reactive ion etching in a gaseous mixture, converting all copper in said seed layer to copper chloride;

removing the copper chloride by rinsing in very dilute hydrochloric acid, thereby forming the flat coil and exposing said tantalum layer; and exposing the coil and the tantalum to an oxygen plasma thereby removing any remaining copper chloride and converting all tantalum to tantalum oxide.

30. The process of claim 29 wherein the tantalum layer is deposited to a thickness that is between about 10 and 200 Angstroms.

* * * * *